United States Patent
Umezawa et al.

(10) Patent No.: US 10,911,153 B2
(45) Date of Patent: Feb. 2, 2021

(54) HIGH-SPEED PHOTODETECTOR ARRAY

(71) Applicant: NATIONAL INSTITUTE OF INFORMATION AND COMMUNICATIONS TECHNOLOGY, Koganei (JP)

(72) Inventors: Toshimasa Umezawa, Koganei (JP); Takahide Sakamoto, Koganei (JP); Atsushi Kanno, Koganei (JP); Naokatsu Yamamoto, Koganei (JP); Tetsuya Kawanishi, Koganei (JP)

(73) Assignee: National Institute of Information and Communications Technology, Tokyo (JP)

( * ) Notice: Subject to any disclaimer, the term of this patent is extended or adjusted under 35 U.S.C. 154(b) by 0 days.

(21) Appl. No.: 16/494,766

(22) PCT Filed: Mar. 7, 2018

(86) PCT No.: PCT/JP2018/008725
§ 371 (c)(1),
(2) Date: Sep. 16, 2019

(87) PCT Pub. No.: WO2018/168597
PCT Pub. Date: Sep. 20, 2018

(65) Prior Publication Data
US 2020/0044745 A1    Feb. 6, 2020

(30) Foreign Application Priority Data

Mar. 17, 2017    (JP) ................................ 2017-053741

(51) Int. Cl.
*H04B 10/00*    (2013.01)
*H04B 10/60*    (2013.01)
(Continued)

(52) U.S. Cl.
CPC ............... *H04B 10/60* (2013.01); *G02B 6/42* (2013.01); *H01L 27/1446* (2013.01); *H04B 10/2581* (2013.01); *H04J 14/04* (2013.01)

(58) Field of Classification Search
USPC .................................................. 398/202–214
See application file for complete search history.

(56) References Cited

U.S. PATENT DOCUMENTS 4,888,817 A * 12/1989 Ryu ....................... H04B 10/61
398/205
5,299,047 A * 3/1994 Kasturia ............ H04B 10/2569
398/152
(Continued)

FOREIGN PATENT DOCUMENTS

JP      8-240825 A      9/1996
JP     10-112554 A      4/1998
(Continued)

OTHER PUBLICATIONS

International Search Report of International Patent Application No. PCT/JP2018/008725 completed Mar. 30, 2018 and dated Apr. 10, 2018 (4 pages).
(Continued)

*Primary Examiner* — Agustin Bello
(74) *Attorney, Agent, or Firm* — Pyprus Pte Ltd

(57) ABSTRACT

To provide a photodetector which enables reception of massively parallel optical communication, and with which a large volume of data for multi-mode transmission or multi-core transmission can be received instantaneously at once. A photodetector comprising a two-dimensional photodetector array in which a plurality of photodetectors 9 are arranged in a two-dimensional array, and which includes a wire 12 having a width of not more than 4 μm between the plurality of photodetectors. Each of the photodetectors has a light reception area with a side measuring not more than 100 μm.

(Continued)

The plurality of photodetectors arranged in a two-dimensional array are spaced apart from each other by not less than 20 μm.

4 Claims, 9 Drawing Sheets

(51) Int. Cl.
  *G02B 6/42* (2006.01)
  *H01L 27/144* (2006.01)
  *H04B 10/2581* (2013.01)
  *H04J 14/04* (2006.01)

(56) References Cited

U.S. PATENT DOCUMENTS

| | | | | |
|---|---|---|---|---|
| 5,388,088 A * | 2/1995 | Gans | ............... | H04B 10/697 398/152 |
| 5,892,605 A * | 4/1999 | Stevens | ............... | H04Q 11/0001 398/182 |
| 6,434,308 B1 * | 8/2002 | Trezza | ............... | G02B 6/4249 385/115 |
| 6,920,290 B2 * | 7/2005 | Mitra | ............... | H01S 3/2383 398/202 |
| 7,230,227 B2 * | 6/2007 | Wilcken | ............... | H04B 10/1121 250/208.2 |
| 7,274,081 B2 * | 9/2007 | Iguchi | ............... | H01L 27/1446 257/184 |
| 8,204,378 B1 * | 6/2012 | Marsland, Jr. | ............... | H04B 10/613 398/152 |
| 8,229,304 B1 * | 7/2012 | Pepper | ............... | H04B 10/61 398/162 |
| 8,355,638 B2 * | 1/2013 | Essiambre | ............... | H04B 10/2581 398/143 |
| 9,184,190 B2 * | 11/2015 | Sato | ............... | H01L 27/1446 |
| 9,748,428 B2 * | 8/2017 | Nagano | ............... | H01L 27/144 |
| 10,411,812 B1 * | 9/2019 | Rose | ............... | H04Q 11/0005 |
| 2005/0041980 A1 * | 2/2005 | Ueyanagi | ............... | H04B 10/1149 398/156 |
| 2007/0041729 A1 * | 2/2007 | Heinz | ............... | G01B 11/303 398/25 |
| 2009/0121306 A1 * | 5/2009 | Ishikawa | ............... | H01L 31/107 257/438 |
| 2009/0304397 A1 * | 12/2009 | Inoue | ............... | H01L 27/1446 398/202 |
| 2010/0080565 A1 * | 4/2010 | Li | ............... | H04B 10/1121 398/119 |
| 2010/0111525 A1 * | 5/2010 | Ford | ............... | H04J 14/00 398/43 |
| 2010/0301442 A1 * | 12/2010 | Iwai | ............... | H01L 31/022416 257/437 |
| 2012/0155890 A1 * | 6/2012 | Zhou | ............... | H04B 10/6165 398/208 |
| 2014/0193165 A1 * | 7/2014 | Kim | ............... | G02B 6/4225 398/212 |
| 2015/0139638 A1 * | 5/2015 | Ma | ............... | G02B 6/3801 398/16 |
| 2016/0036535 A1 * | 2/2016 | Staver | ............... | G01J 9/04 398/207 |
| 2016/0284760 A1 * | 9/2016 | Yamamoto | ............... | H01L 27/1443 |
| 2020/0044745 A1 * | 2/2020 | Umezawa | ............... | H01L 27/1446 |

FOREIGN PATENT DOCUMENTS

| | | |
|---|---|---|
| JP | 2001-352094 A | 12/2001 |
| JP | 2005-251890 A | 9/2005 |
| JP | 2012-99580 A | 5/2012 |
| JP | 2012-533915 A | 12/2012 |
| JP | 2013-38216 A | 2/2013 |

OTHER PUBLICATIONS

Written Opinion of International Patent Application No. PCT/JP2018/008725 completed Mar. 30, 2018 and dated Apr. 10, 2018 (5 pages).
Sanpei et al, WD200 WDM Monitor, 2002.

* cited by examiner

I value (In-phase)

HIGH-SPEED PHOTODETECTOR ARRAY

TECHNICAL FIELD

The present invention relates to a photodetector for use in optical information communication.

BACKGROUND ART

Optical communication capacity has been steadily increasing in recent years, and further increases in transmission capacity will continue to be necessary in the future. Optical communication includes optical fiber wired communication as well as optical fiber wireless communication combining wireless technology with optical communication. Wired communication is mainly used as the current backbone of optical communication because it allows for high-capacity transmission, but going forward, considering mobile backhaul applications and the like, increasing optical access-based capacity using optical fiber wireless technology is likely to be an important endeavor. Further, the application within data centers is becoming a field that has been attracting attention recently with regard to short-range optical fiber communication, and high-capacity optical communication at distances within 1 km is now in demand. In all of these fields of application, WDM technology and multi-level modulation have been implemented to increase the data communication speed/capacity, but in recent years, increasing the total data capacity by spatial multiplex (SDM) transmission using multi-mode or multi-core transmission is being explored.

Single photodetectors are being utilized in optical communication applications as well as in measurement and analysis fields, and thereby increases in sensitivity and speed have been achieved. In particular, the operation speed of photodetectors for optical communication has now exceeded 100 GHz. Meanwhile, there are also reports of split photodetectors, such as a one-dimensional device in which photodetectors are arranged linearly as well as a two-dimensional type in which multiply divided photodetectors are arranged in a tiled manner. Among one-dimensional photodetectors, a 640-pixel type has been reported as a sensor for a spectroscopic monitor in WDM optical communication (NPTL 1).

CITATION LIST

Non-Patent Literature

NPTL 1: S. Sanpei, et al., "WD 200 WDM monitor", Yokogawa Tech. Report, No. 34, pp. 17-20, 2002.

SUMMARY OF INVENTION

Technical Problem

An object of the present invention is to provide a photodetector which enables reception of massively parallel optical communication, and with which a large volume of data for multi-mode transmission or multi-core transmission can be received instantaneously at once.

Solution to Problem

The present invention relates to a photodetector. This photodetector includes a two-dimensional photodetector array in which a plurality of photodetectors 11 are arranged in a two-dimensional array, and which includes a wire 12 having a width of not more than 4 µm between the plurality of photodetectors. Each of the photodetectors has a light reception area with a side measuring not more than 100 µm. The plurality of photodetectors arranged in a two-dimensional array are spaced apart from each other by not less than 20 µm.

The plurality of photodetectors preferably have a mesa structure.

The photodetector array receives a plurality of lights emitted from a single mode fiber group within a multi-core fiber, and one of the plurality of photodetectors corresponds to a respective light of the plurality of lights.

The photodetector preferably further includes a digital signal processor 25.

The digital signal processor 25 has a weight coefficient allocation unit 27 corresponding to each photodetector included in the plurality of photodetectors. The digital signal processor 25 can receive a signal from each of the plurality of photodetectors, and adjust each weight coefficient to be allocated by the weight coefficient allocation unit 27.

The present invention also provides a reception device that includes the above-described photodetector. The reception device includes: a local light generation source 3 that generates local light to be combined with received light; and a modulation unit 7 having a plurality of modulation regions 5 for applying a plurality of different modulations to a plurality of portions of the local light generated by the local light generation source 3 before the local light is combined with the received light. The photodetector functions as a detection unit having a plurality of detection regions 9 which detect, in each of the plurality of portions of the local light, light which results from combining the received light with the local light to which the plurality of modulations have been applied in the modulation unit 7.

Advantageous Effects of the Invention

The present invention can provide a photodetector which enables reception of massively parallel optical communication, and with which a large volume of data for multi-mode transmission or multi-core transmission can be received instantaneously at once.

BRIEF DESCRIPTION OF DRAWINGS

FIG. 3A illustrates an example of a photodiode and wiring, and FIG. 3B is for explaining an interval between photodiodes.

FIG. 11A illustrates a pattern example of a phase mask. FIG. 11B illustrates a weight coefficient combination example.

DESCRIPTION OF EMBODIMENTS

Embodiments of the present invention will now be explained below using the drawings. The present invention is not limited to the following embodiments, and includes appropriate modifications within a scope that would be obvious to a person skilled in the art from the embodiments described below. In the following, the embodiments of the present invention shall be explained using a spatial coherent matched detector as an example. However, the present invention is not limited to a spatial coherent matched detector.

Figure 1:
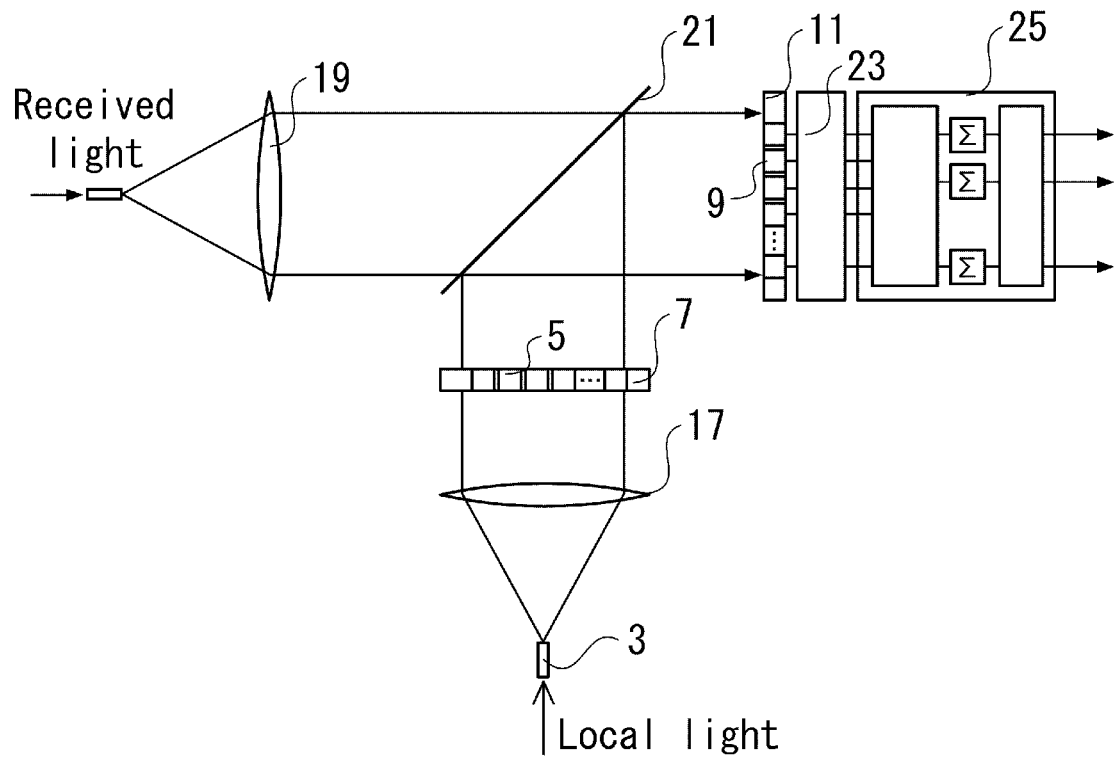
FIG. 1 is a block diagram for explaining a reception device.

FIG. 1 is a block diagram for explaining a reception device. As shown in FIG. 1, the reception device includes: a local light generation source 3 that generates local light to be combined with received light; a modulation unit 7 having a plurality of modulation regions 5; and a detection unit 11 having a plurality of detection regions 9. The modulation unit 7 has the plurality of modulation regions 5 for applying a plurality of different modulations to a plurality of portions of the local light generated by the local light generation source before the local light is combined with the received light. The detection unit 11 has the plurality of detection regions 9 which detect, in each of the plurality of portions of the local light, light which results from combining the received light with the local light to which the plurality of modulations have been applied in the modulation unit. Examples of the modulations include amplitude modulation, phase modulation, frequency modulation, amplitude shift, phase shift, frequency shift, and combinations thereof. The example shown in FIG. 1 includes a lens 17 for collimating the local light emitted from the local light generation source 3, a lens 19 for collimating the received light, a half-mirror (combining unit) 21 for combining the collimated received light and the collimated local light, an ADC (analog-digital converter) 23 for digitalizing a detection signal from the detection unit 11, and a DSC (digital signal processor) 25. The DSC 25 includes a coefficient control unit 27, and a MIMO (multiple-input multiple-output) 29.

The received light may be emitted light from a multi-core fiber (MCF) or a few-core fiber (FCF). The received light may be spatial multiplexing signal such as mode division multiplexing (MDM) light. The reception device of FIG. 1 is a coherent light receiver which can receive light of an arbitrary multiplex mode. The reception device can be used as a coherent receiver in not only wavelength multiplex transmission, polarization multiplex transmission, spatial multiplex transmission, and multi-mode optical transmission, but also single-mode optical transmission as well.

Figure 2:
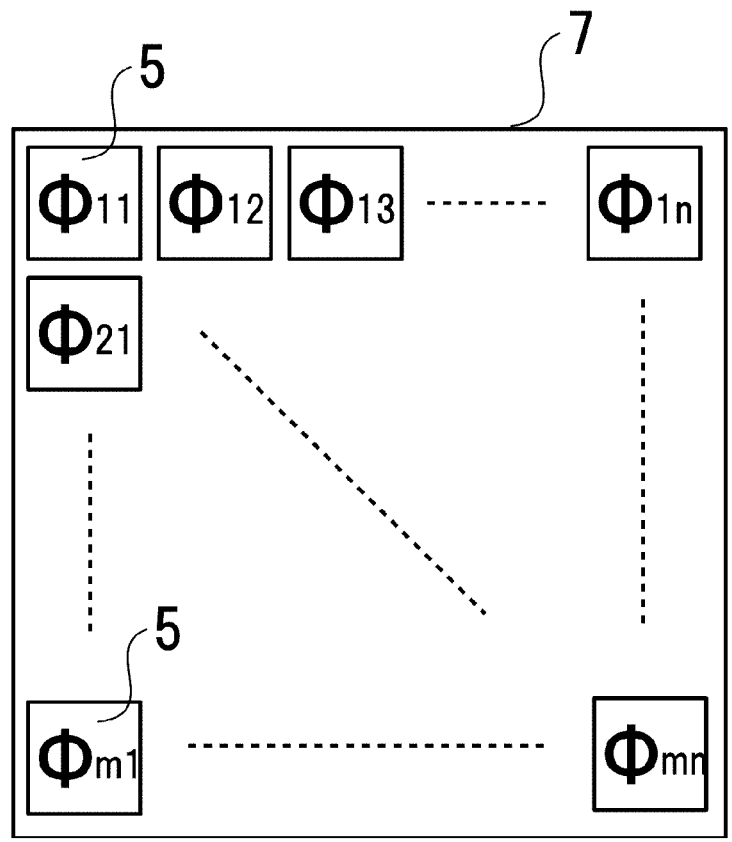
FIG. 2 is a schematic view for explaining a modulation unit having a plurality of modulation regions.

FIG. 2 is a schematic view for explaining the modulation unit having the plurality of modulation regions. As shown in FIG. 2, the modulation unit 7 has the plurality of modulation regions 5. Light which is emitted from the local light generation source 3 and collimated by the lens 17 passes through the plurality of modulation regions 5 which are present in the modulation unit 7. Therein, the light receives modulation corresponding to each of the plurality of modulation regions 5. An example of the modulation in the plurality of modulation regions 5 is phase modulation. For example, the plurality of modulation regions 5 may perform phase modulation of either 0 or $\pi$, or may perform modulation of one of 0, $\pi/2$, $\pi$, and $3\pi/2$. The plurality of modulation regions 5 may perform amplitude modulation, and may perform frequency modulation. Each modulation region 5 of the modulation unit 7 (mask) may be provided with an optical modulator, and each optical modulator may be connected to a control unit so as to perform an arbitrary modulation.

The plurality of modulation regions 5 may be provided in a lattice shape, or may be provided in any arrangement. In the plurality of modulation regions 5, at least 4 optical modulators are present on each lattice point. In the example of FIG. 2, there are m×n modulation regions. Other examples of the plurality of modulation regions 5 include 2×2 (two in the vertical direction and two in the horizontal direction), a structure in which four 2×2 exist on one surface (4×4), 3×3, 5×5, 6×6, 4×6, 8×8, and 12×12.

A preferable example of the local light generation source 3 is a local light generation source which can sweep a wavelength. A wavelength-sweeping light source is publicly known as disclosed in, for example, WO 2007/148413 A1. Another preferable example of the local light generation source 3 is an optical comb signal generator. An optical comb signal generator is publicly known as disclosed in, for example, JP 2006-17748 A and JP 2011-221366 A.

The combining unit 21 is an element for combining the received light and the local light to which the plurality of modulations have been applied in the modulation unit. Examples of the combining unit 21 include a half-mirror and a beam splitter.

Photodetector (Detection Unit)

Figure 3:
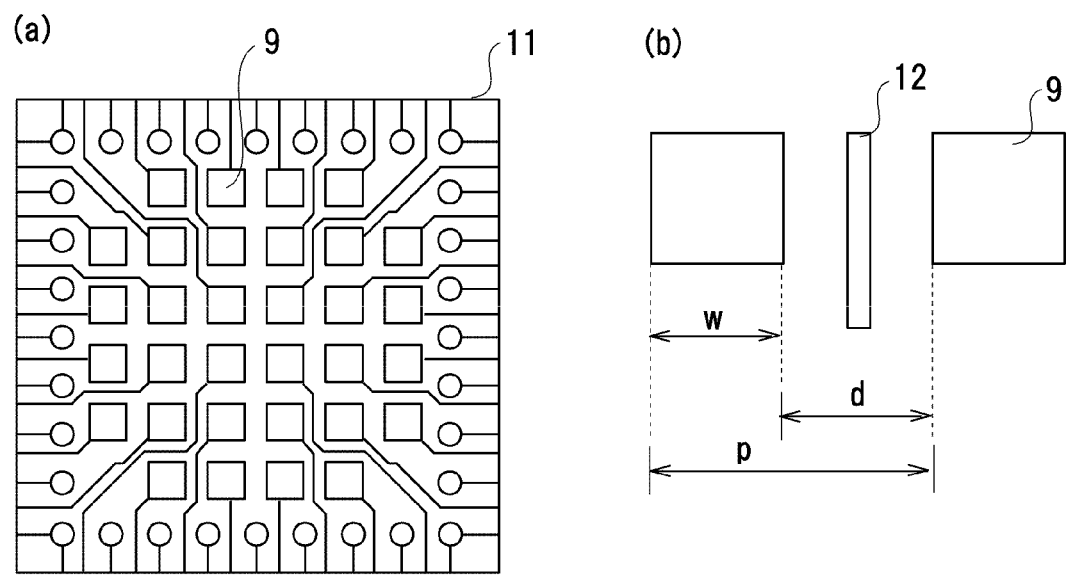
FIG. 3 is a schematic view illustrating a photodetector.

Next, an example of the photodetector 11 will be explained. FIG. 3 is a schematic view illustrating the photodetector. FIG. 3A illustrates an example of a photodiode and a wire, and FIG. 3B is for explaining an interval between photodiodes. In the photodetector 11 of this example, a plurality of photodetectors (for example, photodiodes) 9 are arranged in a two-dimensional array. The photodiodes 9 may be any publicly-known photodiodes which are used in optical information communication. The photodiodes 9 may constitute pixels of the detector, and correspond respectively to the modulation regions 5 of the modulation unit 7. In the example of the two-dimensional array, at least 4 photodiodes are present on each lattice point. Examples of the two-dimensional array include 2×2 (two in the vertical direction and two in the horizontal direction), a structure in which four 2×2 exist on one surface (4×4), 3×3, 5×5, 6×6, 4×6, 8×8, and 12×12. The plurality of photodetectors arranged in a two-dimensional array are preferably spaced apart from each other by not less than 10 μm (in other words, a distance d between the closest portions of adjacent photodiodes is not less than 10 μm). If this interval is too large, the light detection function deteriorates, and thus the distance d between adjacent photodiodes is preferably from 10 to 100 μm, and may be from 30 to 80 μm, from 30 to 60 μm, or from 40 to 60 μm. The two-dimensional photodetector array of the photodetector preferably has a surface incident structure (a top surface incident structure or an underside surface incident structure).

The photodetector includes a wire 12 having a width of, for example, not more than 4 μm (preferably from 1 to 4 μm, from 1 to 3 μm, or from 2 to 4 μm) between the plurality of photodetectors. The light-receiving region of each photodiode is preferably not more than 100 μm per side (an area of not more than 10,000 μm²).

The plurality of photodiodes preferably have a mesa structure. A mesa structure indicates a structure in which a pn junction is formed in advance by crystal growth and then an element region is cut into an island shape by etching. A photodiode having a mesa structure is publicly known as disclosed in, for example, JP 5842393 B and JP 5386764 B. The photodiodes may have a planar structure. A planar structure indicates a structure in which impurities are selectively added in the depth direction from the top surface of an n-type epitaxial layer which is the cathode layer side, and then this is inverted to the p-type to create an anode. Further, the photodetector is preferably provided with a high-frequency transmission line which can output a high-speed electrical signal of not less than 1 GHz from the two-dimensional photodetector array. Such a high-frequency transmission line has a structure in which, for example, the two-dimensional photodetector array is provided in the center of a base, and a wire that is connected to the wire present in the two-dimensional photodetector array is extended in the circumferential direction of the base. The base is preferably connected to the outside (for example, a digital signal processor to be explained below) by flip chip bonding or wire bonding. These wires are preferably realized by a microstrip line or a coplanar-type transmission line. With such a structure, a photocurrent flows to each photodiode and is converted to an electrical signal, and the electrical signal is output to an external electrical circuit through the transmission line.

The photodetector uses photodiodes for optical communication arranged in an array, and thus unlike CCD, etc., the photodetector can accommodate high-speed signals having a frequency response is 1 GHz or more.

The photodetector array receives a plurality of lights emitted from a single mode fiber group within a multi-core fiber, and one of the plurality of photodetectors corresponds to a respective light of the plurality of lights.

ADC (Analog-Digital Converter)

An ADC 23 is an element that converts the light intensity detected by each photodiode to digital information. There may be an ADC connected to each photodiode to convert a detected value of the photodiode to a digital signal. The ADC outputs the digital signal to a DSP.

DSP (Digital Signal Processor)

Figure 4:
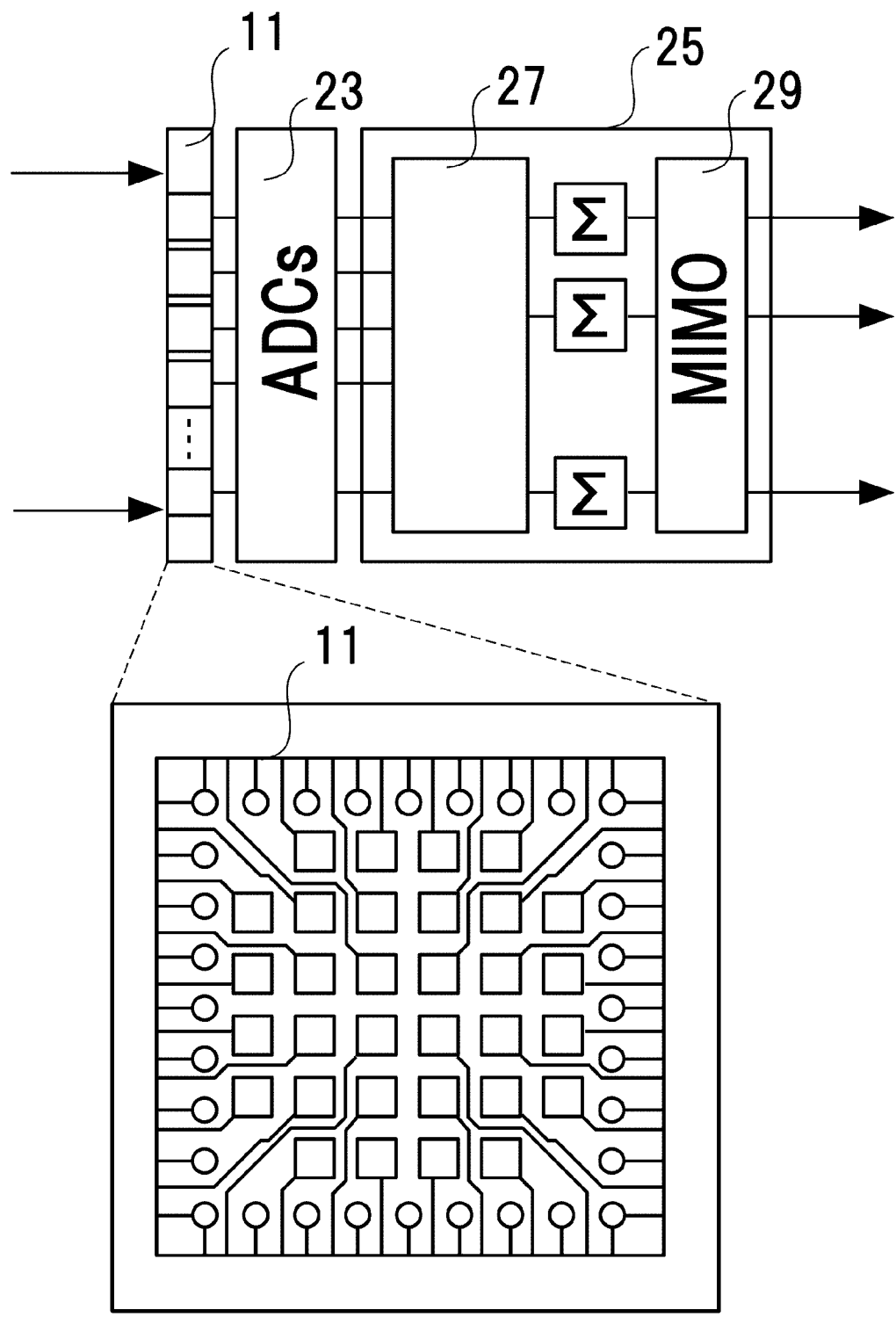
FIG. 4 is a block diagram for explaining a digital signal processor.

The photodetector preferably further includes a digital signal processor (DSP) 25. FIG. 4 is a block diagram for explaining the digital signal processor. The digital signal processor 25 has a weight coefficient allocation unit 27 corresponding to each photodetector included in the plurality of photodetectors. The DSP 25 can adjust each weight coefficient to be allocated by the weight coefficient allocation unit. The DSP 25 receives a digital signal from each of the ADCs 23, and multiplies each digital signal by the weight coefficient and sends the result to a MIMO (multiple-input multiple-output) unit 29. The MIMO unit 29 outputs information resulting from weighting the optical signals from the photodetectors. The received signal can be analyzed upon analyzing the output information.

In this way, signals resulting from multiplying the signals from the plurality of photodetectors by various weight coefficients can be output. Further, by changing the weight coefficient associated with each photodetector, a component detected by a specific photodetector can be extracted.

The photodetector may be used, for example, as a photodetector which directly receives the output from a transmission line combining a multi-core fiber (MCF) and a few-mode fiber (FMF) or a transmission line consisting of an FMF.

In the following, an operational example of the reception device shall be explained. Output light from an MCF enters an output port. Received light which has entered an input port is then emitted toward a lens. The lens 19 receives the received light in a spread state, collimates the received light, and transmits it to the half-mirror 21. Meanwhile, local light is emitted from the local light source 3 and reaches the lens 17 in a state in which the width of the local light has been spread, and then this local light is collimated by the lens 17. The local light which has been emitted from the lens 17 arrives at a phase mask 7. The plurality of phase modulators 5 in the phase mask 7 perform a prescribed phase modulation on each area of the local light. The phase-modulated local light arrives at the half-mirror 21. A light diameter ($w_1$) of the local light upon arriving at the half-mirror is preferably equal to or less than (for example, not less than 90% and not more than 99%) a light diameter ($w_s$) of the received light which has arrived at the half-mirror 21. In the half-mirror 21, the received light and the local light are combined. The portion of the received light having the same phase as that of the local light is intensified, and the portion having the opposite phase is weakened. Thus, in the combined light, there is a portion in which the light intensity is intensified and a portion in which the light intensity is weakened. This intensifying and weakening basically corresponds to the phase modulators 5. The light which was combined in the half-mirror 21 enters the photodetector 11. The photodiodes 9 corresponding to the phase modulators 5 are present in the photodetector 11. Therefore, in the photodetector 11, the intensity of the received light can be measured. The output from each photodiode 9 is converted to a digital signal in the ADC 23, and the digital signal is subjected to signal processing in the DSP 25. The DSP 25 can restore the received light. In more detail, the DSP 25 is configured to be capable of weighting the outputs from the photodiodes 9, and by adjusting this weighting, the DSP 25 can obtain light intensity information of the components according to the phase modulation. Thereby, the mode and modulation scheme of the received light can be classified.

Figure 5:
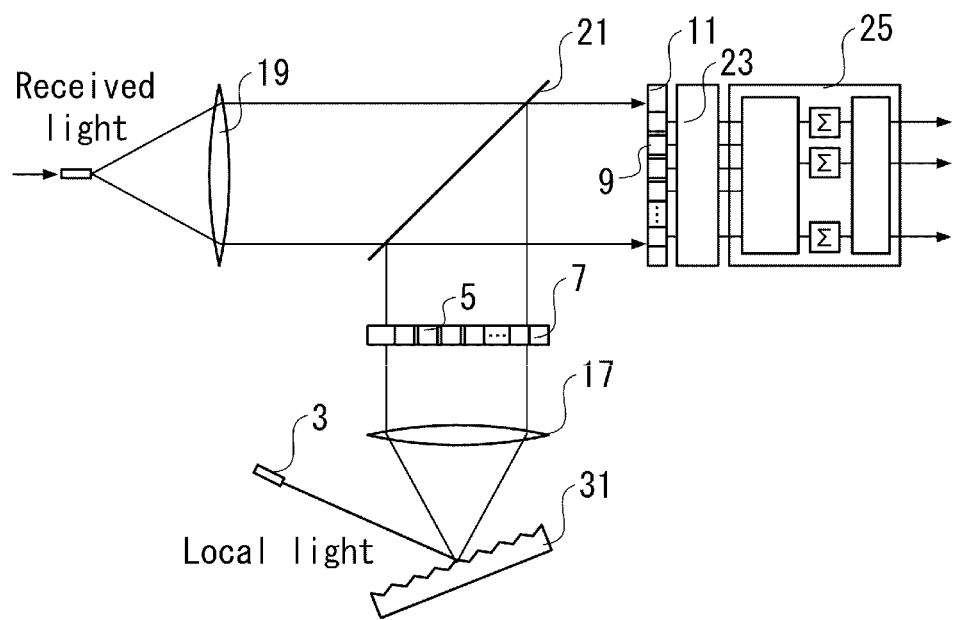
FIG. 5 is a block diagram for explaining a reception device having a grating.

FIG. 5 is a block diagram for explaining a reception device having a grating. In this example, the local light passes through a grating 31 and a lens and then reaches the phase mask 7. An example of the grating is a fiber bragg grating (FBG). As the fiber bragg grating, uniform fiber grating, chirp grating, or multi-section grating is used, and mention may also be made of a modulatable fiber grating. The fiber bragg grating can be obtained by, for example, irradiating ultraviolet rays via the phase mask and changing the index of refraction of the core thereof at a predetermined pitch. By using a grating, wavelength selective coherent detection can be realized. In other words, for example, the locally generated light wavelength is placed in a signal light wavelength band, spatial distribution is applied to the amplitude and phase, etc. of the locally generated light, and a beat component between the signal light and the locally generated light is detected using single light detection or multiple photodetectors. Thereby, the amplitude, time change of the phase, spatial distribution, and change information of the locally generated light can be obtained and restored. Placing the locally generated light wavelength in a signal light wavelength band means, for example, placing a locally generated light wavelength $\lambda_L$ in a region between $\lambda_1$ and $\lambda_2$ when an occupied light wavelength of the signal light wavelength is between $\lambda_1$ and $\lambda_2$ (wherein $\lambda_1 < \lambda_2$).

Figure 6:
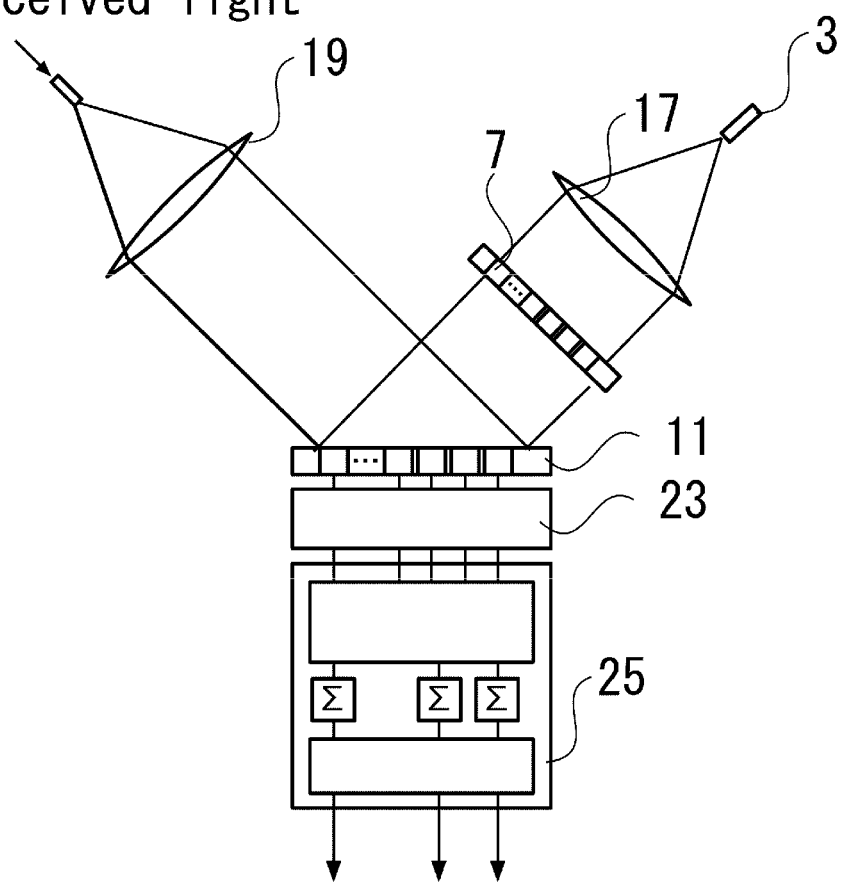
FIG. 6 is a block diagram for explaining a reception device which does not use a combining unit.

FIG. 6 is a block diagram for explaining a reception device which does not use a combining unit. In the example shown in FIG. 6, a combining unit for combining the received light and the local light does not exist because the received light and the local light are combined in the photodetector. With such a configuration, the optical elements can be reduced.

Figure 7:
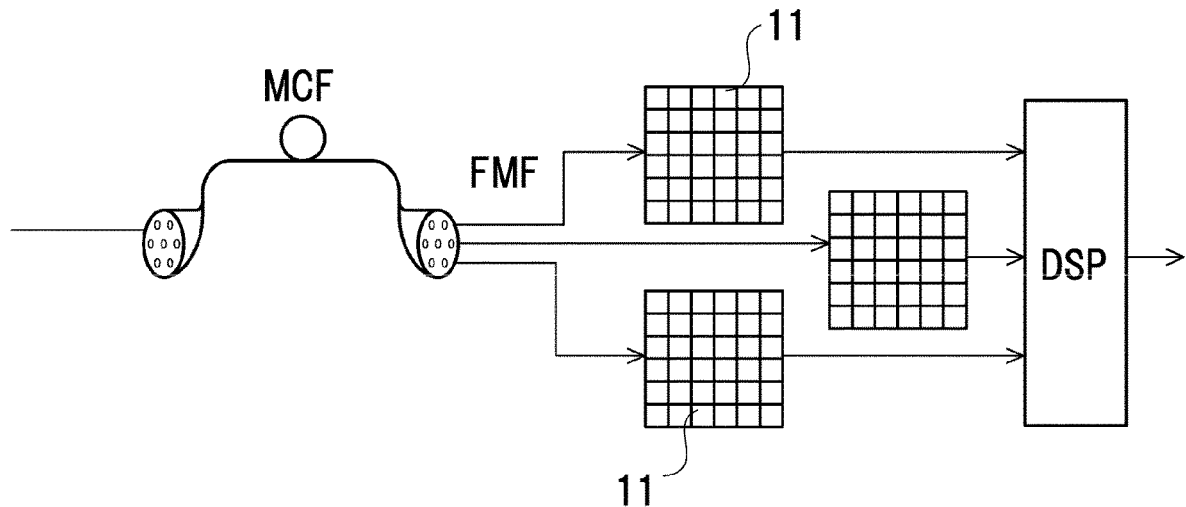
FIG. 7 is a schematic view illustrating an example of a method for utilizing the photodetector.

FIG. 7 is a schematic view illustrating an example of a method for utilizing the photodetector. In this example, output light from a transmission line to which a multi-core fiber (MCF) and a few-mode fiber (FMF) are connected is received using a plurality of the photodetectors 11, and a received signal is analyzed by each of the photodetectors (as well as the ADCs and DSP connected thereto).

The above-described photodetector may also be used in the following use. Light from an MCF is condensed with a lens, etc., and is directly optically coupled to the photodetectors. The arrangement of the pixels of the photodetector should be determined in accordance with the core arrangement of the MCF (triangle arrangement, quadrangle arrangement). In the prior art, a DEMUX device that converts the MCF to a plurality of single fibers was necessary, or it was necessary to connect a plurality of single fibers after the DEMUX device and provide receivers corresponding to the single fibers. If the above-described photodetector is used, a DEMUX device is unnecessary, and the plurality of receivers which were necessary in an amount matching the number of outputs can be consolidated to a single receiver. Therefore, if the above-described photodetector is used, the receiving-side system configuration can be simplified, and this makes a significant contribution to the design of a small transceiver, etc. Further, by using the above-described photodetector in mode division multiplex transmission using an orbital angular momentum (OAM), a light DEMUX device and a receiver for a late-stage single mode become unnecessary, and an OAM optical signal can be directly received. This enables instantaneous mode determination and data reception. By connecting a small antenna such as a batch antenna to each element in a two-dimensional PDA, and performing phase control to each photodetector element using an electrical or optical means, a two-dimensional phased array antenna can be produced. Since the photodetector single element can be designed to operate at 100 GHz or more, it is possible to produce a two-dimensional phased array antenna of a microwave band to a millimeter wave band or a THz band.

Embodiment 1

In this embodiment, a novel method called "spatial coherent matched detection" which enables high-speed mode separation and coherent detection to be performed photoelectrically shall be proposed and discussed.

Figure 8:
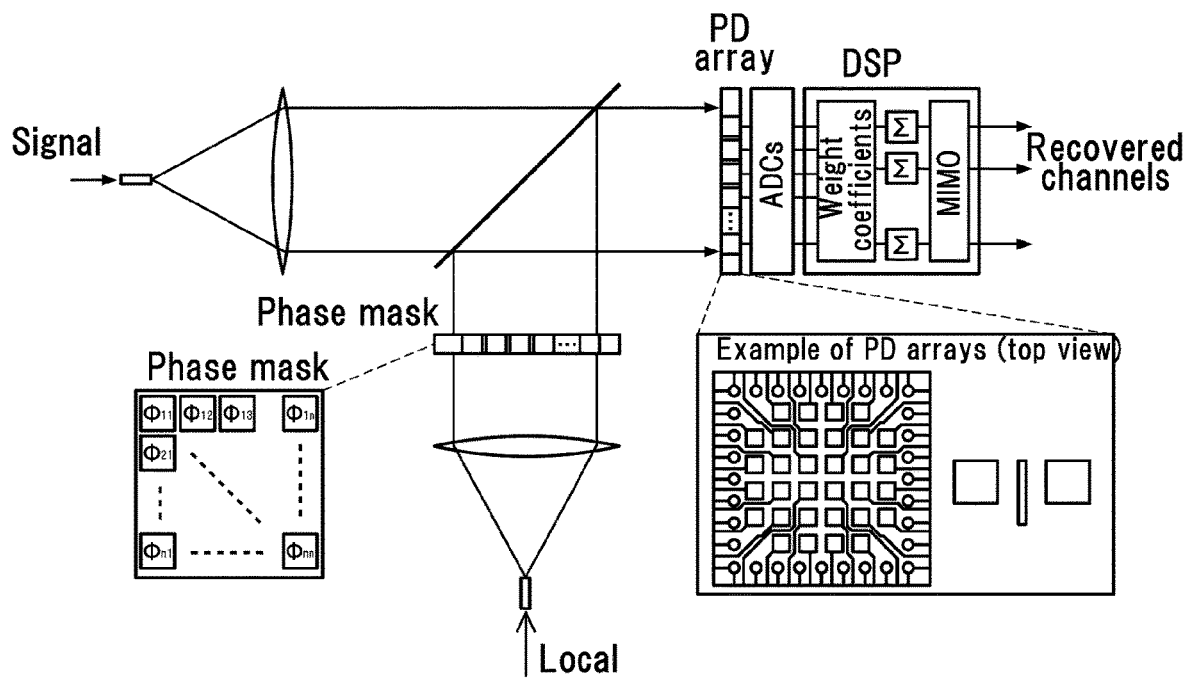
FIG. 8 is a schematic view for explaining a spatial coherent matched detector of one embodiment.

The principles of the above are shown in FIG. 8. FIG. 8 is a schematic view for explaining a spatial coherent matched detector of this embodiment. The spatial coherent matched detector includes a half-mirror, local light, a phase mask, a photodiode (PD) array, and a digital signal processor (DSP). A signal and the local light are input from a signal port and a local port and then collimated. The two lights are joined in the half-mirror, and then enter the PD array. The signal and the local light are sufficiently spatially spread at a beam size which covers the active area of the PD array. The PD array has a structure in which a common light input and a plurality of output electrodes are arranged in a two-dimensional matrix, and photoelectric currents at different positions are extracted separately. Each element of the PD array is based on conventional PD technology, and thus high bandwidth detection of 10 Gbaud or more is possible. In the detection system, a phase mask having a special phase pattern is disposed on the local port side. Using this phase mask, the phase pattern of the local beam is controlled. Therefore, the optical phase of local light that is input into each element of the PD array is controlled as necessary. On the other hand, the signal light enters the PD array as is, and thus the relative phase difference between the signal light and the local light can be independently controlled with the PD laser.

Figure 9:
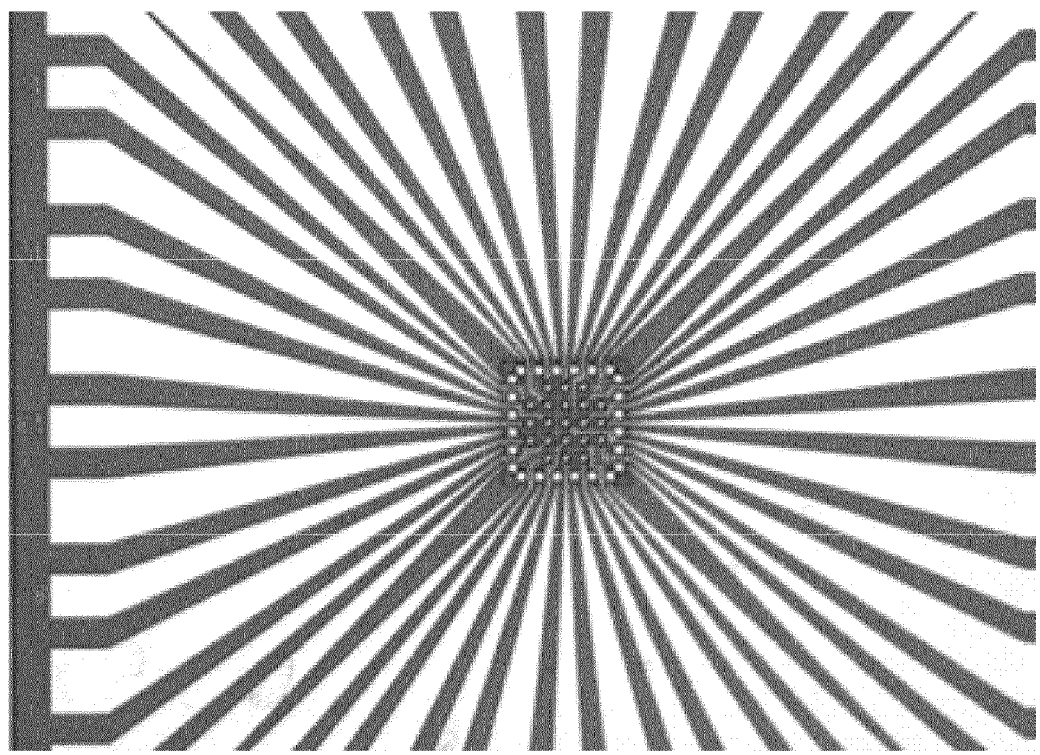
FIG. 9 illustrates a design example of a PD array.
Figure 10:
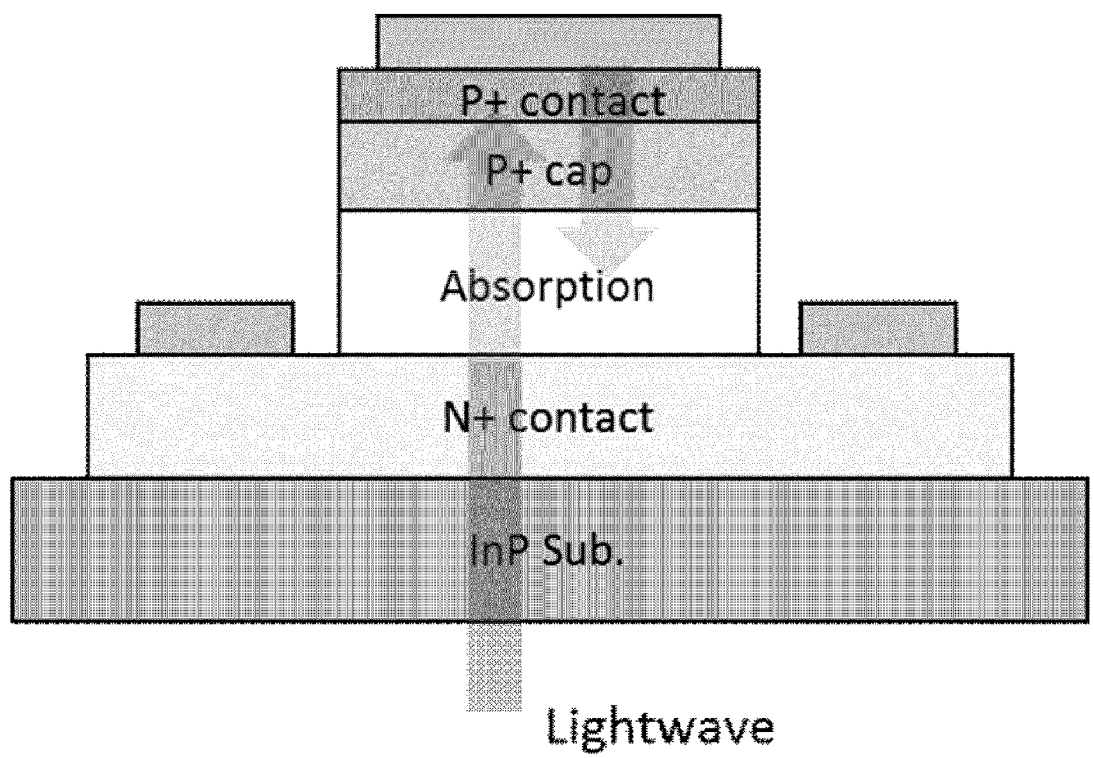
FIG. 10 illustrates an example of an underside surface incident cross-section structure of the PD array.

FIG. 9 illustrates a design example of the PD array. As shown in FIG. 9, the PD array is provided with a high-frequency transmission line for extracting high-speed electrical signals of 1 GHz or more to the outside. FIG. 10 illustrates an example of an underside surface incident cross-section structure of the PD array. High-speed photodetectors (size: not more than about 100 μm×100 μm) processed to a tile shape are arranged two-dimensionally. Each photodetector is provided with a wire of about 4 μm for connecting the electrical output of the photodetector to an external electrical circuit. Since the electrical signals are high-speed signals of 1 GHz or more, a microstrip line or a coplanar-type transmission line is provided for extracting the signals to the external circuit. The high-speed optical signal is incident through the top surface or the underside surface. Thereby, a photocurrent flows to each photodetector, is converted therein to an electrical signal, and is output to the external electrical circuit through the transmission line.

For example, if a phase offset of $\pi/2$ is imparted between two PD elements within the array, an in-phase (I) component and a quadrature (Q) component of the signal are detected simultaneously, and thus coherent detection is achieved. When separating spatial modes, it is necessary to sum all of the photocurrents from the PD elements by imparting a phase offset which matches the modal pattern. By appropriately modifying the weight coefficient of the heat current for the addition process, an arbitrary orthogonal mode can be dynamically selected without changing the optical configuration.

The weight coefficients can be simply controlled by the DSP, and parallel detection of all of the mode channels can be realized without optical mode division before the light detection. For example, if a phase offset of $\pi/2$ is imparted between two PD elements within the array, an in-phase (I) component and a quadrature (Q) component of the signal are detected simultaneously, and thus coherent detection is achieved. When separating spatial modes, all of the photocurrents from the PD elements should be summed by imparting a phase offset which matches the mode pattern. By appropriately modifying the weight coefficient of the heat current for the addition process, an arbitrary orthogonal mode can be dynamically selected without changing the optical configuration. The weight coefficients can be simply controlled by the DSP, and parallel detection of all of the mode channels can be realized without optical mode division before the light detection.

The most important aspect of this technology is that the received MDM signal does not have to be subjected to a spatial filter or some other optical signal processing. The signal is simply input into the photodiode array which has a single common optical input surface. With a single set of such a PD array, all of the modal channels can be detected individually. The spatial modes can be orthogonally separated without changing the phase mask pattern. The present inventors used the DSP to select a combination of photocurrents detected by the array elements. The detection system can be flexibly upgraded to accommodate other MDM signals in which different mode numbers are multiplexed. If the matrix size is sufficiently large, 3, 5, or even higher order MDM signals can be detected.

Further, the detection scheme does not suffer mode division loss. Intrinsic loss is ideally 3 dB regardless of the mode loss, and this is equivalent to a single-channel phase diversity coherent receiver and a coherent matched detector. The intrinsic loss is converted to an optical mode splitter modal number of a conventional phase plate base which proportionally increases the optical loss (the theoretical loss in FIG. 8 is 6 dB, but this can be improved to 3 dB by changing to a balance-type detection configuration using the other output port of the half-mirror).

Figure 11:
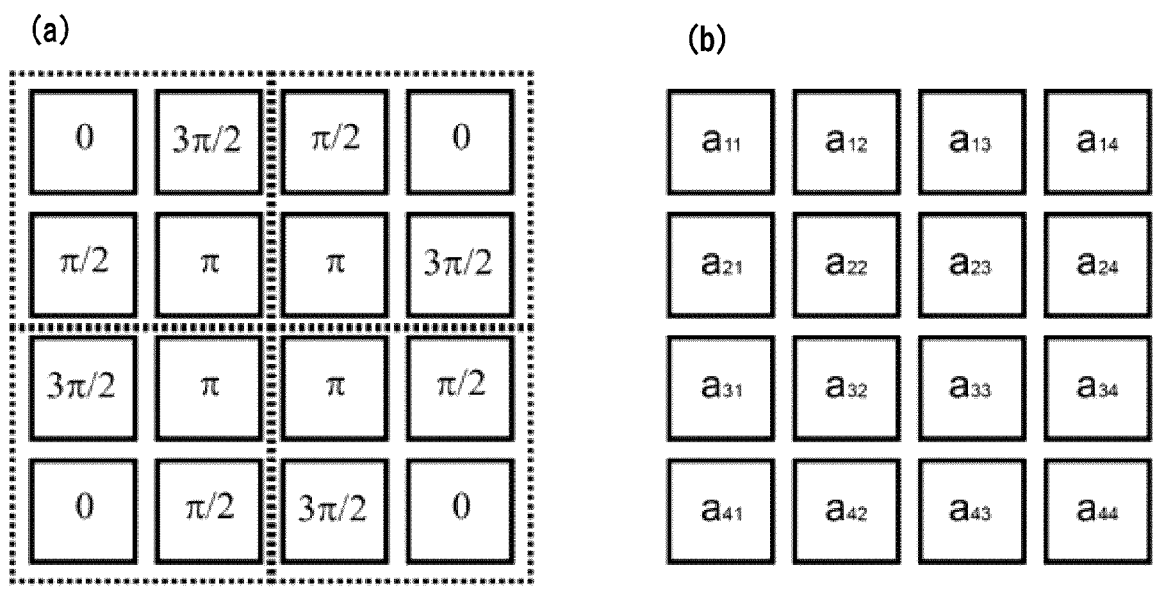
FIG. 11 illustrates a 4×4 phase pattern to be considered herein.

Herein, the spatial coherent matched detector shall be considered with a focus on mode separation and detection of a three-mode MDM signal using a 4×4 PD array. Numerical analysis was carried out to prove this concept. FIG. 11 illustrates a 4×4 phase pattern that is considered herein. FIG. 11A illustrates a pattern example of a phase mask. FIG. 11B illustrates a weight coefficient combination example. The phase mask is constituted by four sets of sub phase masks which are surrounded by the dashed lines in FIG. 11. In each sub phase mask, there are four regions which impart phase shifts of 0, $\pi/2$, $\pi$, and $3\pi/2$. A pair of PD elements corresponding to the [0, $\pi$] phase shift functions as a balanced detection of the in-phase component of the received signal. The quadrature component is detected using a pair of PDs [$\pi/2$, $3\pi/2$]. When all of the photocurrents from the PD array are totaled, mode separation is achieved by merely changing the weight coefficient combination. An LP01 mode is detected when all of the photocurrents are totaled using the following weight coefficient matrix.

$A=[a_{ij}]=$[1 0 0 1; 0 −1 −1 0; 0 −1 −1 0; 1 0 0 1] (in case of I component).

[0 −1 1 0; 1 0 0 −1; −1 0 0 1; 0 1 −1 0] (in case of Q component).

Further, detection of an LP11a mode and an LP11b mode are as follows:

[1 0 0 −1; 0 −1 1 0; 0 −1 1 0; 1 0 0 −1] (LP11a-I),

[0 −1 −1 0; 1 0 0 1; −1 0 0 −1; 0 1 1 0] (LP11a-Q), and

[1 0 0 1; 0 −1 −1 0; 0 1 1 0; −1 0 0 −1] (LP11b-I),

[0 −1 1 0; 1 0 0 −1; 1 0 0 −1; 0 −1 1 0] (LP11b-Q).

Figure 12:
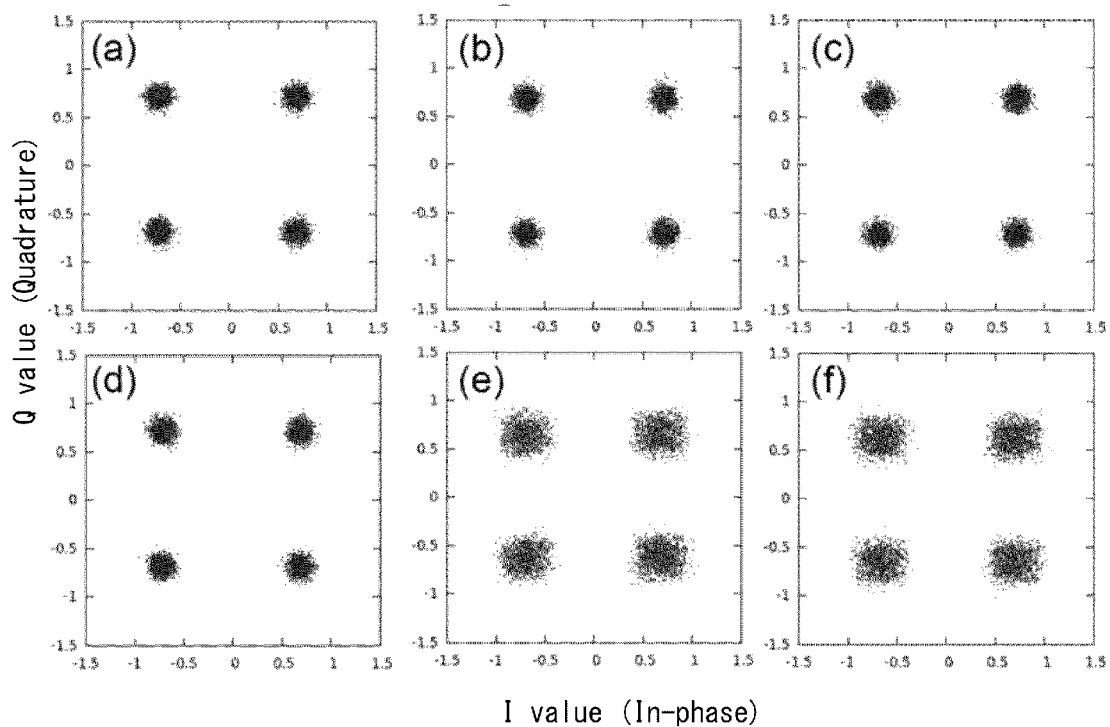
FIG. 12 shows, in place of a drawing, graphs illustrating the results of calculating arrangements restored by a DSP with a focus on reception of a 20-Gb/s QPSK signal for each mode.

FIG. 12 shows the results of calculating arrangements restored by the DSP with a focus on reception of a 20-Gb/s QPSK signal for each mode, e.g. a 3×20-Gb/s MDM QPSK signal. In this calculation, the OSNR at 0.1 nm was assumed to be 20 dB. The signal is separated by applying a multiple-input multiple-output (MIMO) equalizer, and cross-talk between mode channels is suppressed. FIGS. 12A to 12C show the channel arrangements of modes corresponding to the LP01, LP11a and LP11b modes obtained when all of the channels are multiplexed and received by the spatial coherent matched detector. To give a brief explanation, in the spatial coherent matched detector, it is assumed that all modes are retained. Therefore, it is understood that all of the channels are restored separately without any cross-talk. This means that the system can orthogonally demultiplex the channels of all of the modes of the MDM signal. Further, the arrangements obtained when the angle of the PD array (and that of the phase mask) was inclined by 0.1π[rad] relative to the MDM mode were calculated. These arrangements are shown in FIGS. 12D to 12F. Under these circumstances, the balance of the light detection in the subset PD becomes incomplete. Therefore, the unbalanced component cannot be completely compensated by MIMO. The present inventors believe that the MIMO processing can be changed, and/or the spatial resolution of the PD array (having a larger matrix scale) can be improved.

In conclusion, the present inventors have proposed and discussed a two-dimensional spatial coherent matched detector based on a high-speed PD array. Through numerical analysis of the arrangements by a 4×4 matrix which detects a 3×20 Gb/s MDM QPSK signal, it is understood that the MDM signal can be photoelectrically branched and received coherently. Unlike a conventional MDM demultiplexer, the received signal is not subjected to spatial filtering and optical splitting, and the spatial coherent matched detector is ideally useful in reducing the loss of 3 dB which is equal to that of a single-channel coherent receiver.

Embodiment 2

Figure 13:
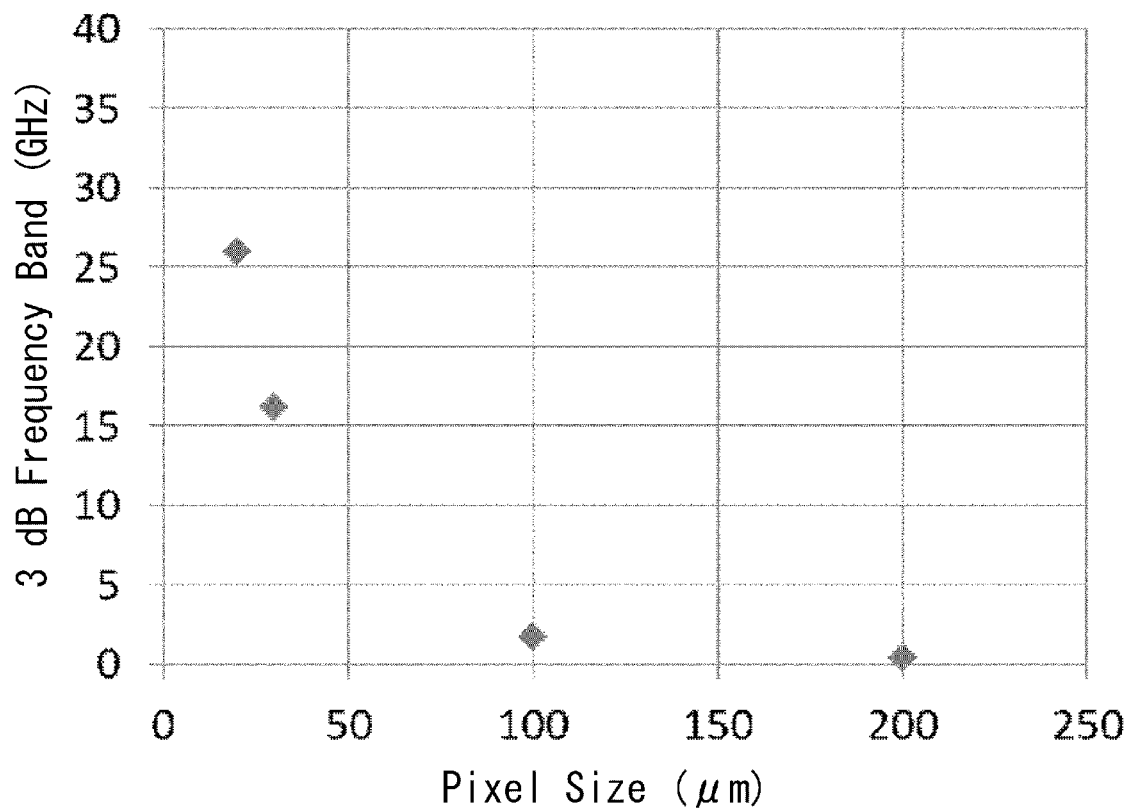
FIG. 13 shows, in place of a drawing, a graph illustrating a calculation estimate of a 3 dB frequency band relative to the size (pn junction area) of a photodetector.

FIG. 13 shows, in place of a drawing, a graph illustrating a calculation estimate of a 3 dB frequency band relative to the size (pn junction area) of a photodetector. From FIG. 13, it is understood that a band of about 1 GHz or more can be obtained by setting the size of the photodetector to not more than 100 μm×100 μm.

Embodiment 3

Figure 14:
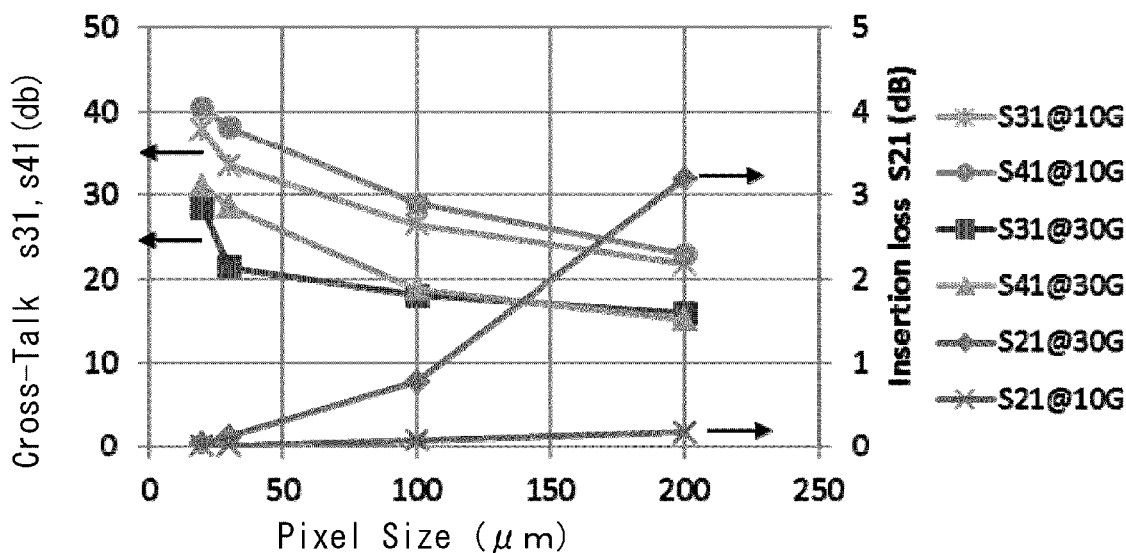
FIG. 14 shows, in place of a drawing, a graph illustrating calculated examples of cross-talk amount and insertion loss.

FIG. 14 shows, in place of a drawing, a graph illustrating calculated examples of cross-talk amount and insertion loss. As shown in FIG. 14, when the pixel size per pixel is 100 μm×100 μm, the wire width is 4 μm, the space is 14 μm, and the pixel interval is 64 μm, RF cross-talk of not more than 20 dB can be achieved at a frequency of 30 GHz or less. Similarly, when the pixel size per pixel is 20 μm×20 μm, the wire width is 4 μm, the space is 14 μm, and the pixel interval is 44 μm, RF cross-talk of not more than 20 dB can be achieved at a frequency of 30 GHz or less.

INDUSTRIAL APPLICABILITY

The present invention can be used in the field of optical information communication.

REFERENCE SIGNS LIST

3 . . . local light source
5 . . . modulation region (modulator)
7 . . . modulation unit
9 . . . detection region (photodetector, photodiode)
11 . . . detection unit
12 . . . wire
17 . . . lens
19 . . . lens
21 . . . combining unit (half-mirror)
23 . . . ADC
25 . . . digital signal processor (DSP)
27 . . . weight coefficient allocation unit

The invention claimed is:
1. A photodetector comprising
    a two-dimensional photodetector array in which a plurality of photodetectors (9) are arranged in a two-dimensional array, and which includes a wire (12) having a width of not more than 4 μm between the plurality of photodetectors;

wherein each of the photodetectors has a light reception area with a side measuring not more than 100 μm;

wherein the plurality of photodetectors arranged in a two-dimensional array are so configured that the distance d between adjacent photodiodes is not less than 20 μm; wherein the plurality of photodetectors have a mesa structure; and wherein each of the plurality of photodetectors (9) comprises:

an underside substrate into which optical light incidents;

a light absorb layer into which the optical light passing through the underside substrate incidents; and a surface electrode to which a remaining light which is not absorbed by the light absorb layer incidents;

wherein the remaining light reflects at the surface electrode and the reflected remaining light incidents into the light absorb layer.

2. The photodetector according to claim 1, wherein the photodetector array receives a plurality of lights emitted from a single mode fiber group within a multi-core fiber, and one of the plurality of photodetectors corresponds to a respective light of the plurality of lights.

3. The photodetector according to claim 1 further comprising
a digital signal processor (25), wherein the digital signal processor (25) has a weight coefficient allocation unit (27) corresponding to each photodetector included in the plurality of photodetectors, and the digital signal processor (25) can receive a signal from each of the plurality of photodetectors, and adjust each weight coefficient to be allocated by the weight coefficient allocation unit (27).

4. A reception device comprising the photodetector according to claim 1, wherein the reception device further comprises:

a local light generation source (3) that generates local light to be combined with received light; and a modulation unit (7) having a plurality of modulation regions (5) for applying a plurality of different modulations to a plurality of portions of the local light generated by the local light generation source (3) before the local light is combined with the received light, wherein the photodetector functions as a detection unit (11) having a plurality of detection regions (9) which detect, in each of the plurality of portions of the local light, light which results from combining the received light with the local light to which the plurality of modulations have been applied in the modulation unit (7).

* * * * *